(12) United States Patent
Hong (10) Patent No.: US 9,082,641 B2
(45) Date of Patent: Jul. 14, 2015

(54) SEMICONDUCTOR DEVICE WITH CONTACT HOLE AND MANUFACTURING METHOD THEREOF

(71) Applicant: Semiconductor Manufacturing International Corporation (Shanghai), Shanghai (CN)

(72) Inventor: James Hong, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 45 days.

(21) Appl. No.: 13/897,836

(22) Filed: May 20, 2013

(65) Prior Publication Data

US 2014/0070324 A1 Mar. 13, 2014

(30) Foreign Application Priority Data

Sep. 7, 2012 (CN) .......................... 2012 1 0330895

(51) Int. Cl.
*H01L 29/772* (2006.01)
*H01L 27/088* (2006.01)
*H01L 29/66* (2006.01)
*H01L 21/8234* (2006.01)
*H01L 29/49* (2006.01)

(52) U.S. Cl.
CPC ........ *H01L 27/088* (2013.01); *H01L 21/82345* (2013.01); *H01L 29/4966* (2013.01); *H01L 29/66477* (2013.01); *H01L 29/66545* (2013.01)

(58) Field of Classification Search
CPC ..................... H01L 29/42356; H01L 29/4236; H01L 29/495; H01L 29/4958; H01L 29/6656; H01L 29/66545; H01L 21/823814
USPC .......... 257/368, 369; 438/586, 197, 199, 299, 438/597
See application file for complete search history.

(56) References Cited

U.S. PATENT DOCUMENTS

2012/0139061 A1* 6/2012 Ramachandran et al. .... 257/410
2013/0187236 A1* 7/2013 Xie et al. ...................... 257/369

* cited by examiner

*Primary Examiner* — Matthew W Such
*Assistant Examiner* — Scott Stowe
(74) *Attorney, Agent, or Firm* — Innovation Counsel LLP (57) ABSTRACT

A semiconductor device includes a substrate, a first barrier layer disposed on the substrate, a first dielectric layer disposed on the first barrier layer, and a second barrier layer disposed on the first barrier layer. The semiconductor device further includes a third barrier layer and a first metal gate each being disposed between a first portion of the second barrier layer and a second portion of the second barrier layer. The first metal gate is disposed between the third barrier layer and the substrate. The semiconductor device further includes a second dielectric layer. The third barrier layer is disposed between the first metal gate and the second dielectric layer. The semiconductor device further includes a second metal gate. The semiconductor device further includes a contact hole positioned between the first metal gate and the second metal gate.

20 Claims, 5 Drawing Sheets

SEMICONDUCTOR DEVICE WITH CONTACT HOLE AND MANUFACTURING METHOD THEREOF

CROSS-REFERENCE TO RELATED APPLICATIONS

This application claims the benefit of and priority to Chinese Patent Application No. CN201210330895.6, filed on Sep. 7, 2012, which is incorporated by reference herein in its entirety.

FIELD OF THE INVENTION

The application is related to a semiconductor device with a contact hole and is related to a method for manufacturing the semiconductor device.

BACKGROUND

Complementary metal-oxide-semiconductor (CMOS) technologies have been used for manufacturing semiconductor devices. CMOS technologies may include gate-first processing technologies and gate-last processing technologies.

In a gate-first process, a gate is deposited on a gate dielectric layer before source and drain implantation is performed. The gate-first process may involve relatively simple steps. Nevertheless, in the gate-first process, after the gate has been formed, the gate has to endure substantial heat during subsequent processing steps, such as annealing. The heat imposed on the gate may result in a drift of the threshold voltage Vt of the transistor associated with the gate, and the electrical performance of the transistor may be unsatisfactory.

In a gate-last process, a dummy gate (such as polycrystalline silicon) and a source region and a drain region are first formed. The dummy gate is then taken out to form a gate trench. Subsequently a suitable metal fills into the gate trench to form a metal gate. Thus the gate electrode avoids the heat produced during forming the source region and the drain region. As a result, a drift of the threshold voltage Vt of the transistor associated with the gate may be minimized, and the electrical performance of the transistor may be satisfactory.

In a semiconductor device, such as a storage unit, a contact hole may be required for connecting the source electrode or the drain electrode with an upper metal wire. Because of the limited space between the gates, a self-aligned contract hole may be required.

A self-aligned contact hole may be formed in a gate-first process that comprises the following steps: forming a gate on a semiconductor substrate with an oxide layer being disposed between the gate and the substrate; forming spacers at both sides of the gate; forming a protection layer on the gate to cover the gate; forming a source and a drain on the semiconductor substrate; forming a barrier layer on the semiconductor substrate, on outer sides of the spacers, and on the protection layer (which covers the gate), the barrier layer being formed of silicon nitride (SiN); forming an dielectric layer on the silicon nitride; forming a mask layer comprising a pattern of a self-aligned contact hole on the dielectric layer; and etching the dielectric layer to form the self-aligned contact hole having a bottom between two adjacent gates according to the contact hole pattern.

In the gate-first process, the etch selectivity ratio between the SiN barrier layer and the dielectric layer may be substantially high. Therefore, during the etching process in fabricating the contact hole, the loss of the SiN barrier layer may be minimized. As result, a sufficiently thick insulation layer (which may include a substantial portion of the remaining SiN barrier layer) may be formed between the gate and the contact hole. Nevertheless, as discussed above, the gate-first process may result in satisfactory electrical performance of the semiconductor device.

On the other hand, if a self-aligned contact hole is formed in a gate-last process, the top opening of the self-aligned contact hole may be very close to the metal gate. As a result, short-circuit between the self-aligned contact hole and the metal gate may occur. In particular, the risk of short-circuit between the contact hole and the gate may be aggravated due to misalignment during a photolithography and/or etch process in making the self-aligned contact hole.

The above information disclosed in this Background section is for enhancement of understanding of the background of the invention. The Background section may contain information that is not known on one of ordinary skill in the art.

SUMMARY

Embodiments of the present invention may substantially satisfy performance requirements and miniaturization requirements of semiconductor devices.

One or more embodiments of the invention may be related to a semiconductor device that may include a substrate and a first barrier layer disposed on the substrate. The semiconductor device may further include a first dielectric layer disposed on the first barrier layer. The semiconductor device may further include a second barrier layer disposed on the first barrier layer. A first portion of the second barrier layer and a second portion of the second barrier layer may be disposed between a first portion of the first dielectric layer and a second portion of the first dielectric layer. The semiconductor device may further include a third barrier layer disposed between the first portion of the second barrier layer and the second portion of the second barrier layer. The semiconductor device may further include a first metal gate disposed between the first portion of the second barrier layer and the second portion of the second barrier layer and disposed between the third barrier layer and the substrate. The semiconductor device may further include a second dielectric layer. The third barrier layer may be disposed between the first metal gate and the second dielectric layer. The semiconductor device may further include a second metal gate. The semiconductor device may further include a contact hole positioned between the first metal gate and the second metal gate and positioned between the second portion of the first dielectric layer and a third portion of the first dielectric layer.

In one or more embodiments, a first portion of the second dielectric layer is disposed between a first portion of the third barrier layer and a second portion of the third barrier layer, and a third portion of the third barrier layer is disposed between the first portion of the second dielectric layer and the first metal gate.

In one or more embodiments, the first portion of the second dielectric layer is disposed between the third portion of the third barrier layer and a second portion of the second dielectric layer, and the second portion of the second dielectric layer is wider than the first portion of the second dielectric layer.

In one or more embodiments, the semiconductor device may include a fourth barrier layer, wherein the fourth barrier layer overlaps the second dielectric layer and is connected to the third barrier layer, a first portion of the second dielectric layer is disposed between a first portion of the fourth barrier layer and a second portion of the fourth barrier layer, and the first portion of the second dielectric layer is disposed between the second portion of the second dielectric layer and the third portion of the third barrier layer.

In one or more embodiments, the semiconductor device may include a fourth barrier layer, the fourth barrier layer being connected to the third barrier layer and contacting each of the second barrier layer and the first dielectric layer, wherein the first dielectric layer is disposed between the first barrier layer and the fourth barrier layer.

In one or more embodiments, an etch rate of the third barrier layer in an etchant is less than or equal to one sixth of an etch rate of the first dielectric layer in the etchant.

In one or more embodiments, at least one of the second barrier layer and the third barrier layer includes at least one of SiN, SiCN, SiC or SiON, and at least one of the first dielectric layer and the second dielectric layer includes an oxide having a dielectric constant less than 3.

In one or more embodiments, the second dielectric layer includes a glass material.

One or more embodiments of the invention may be related to a method for forming a semiconductor device. The method may include the following steps: disposing a first dummy gate and a second dummy gate on a substrate; disposing a first barrier layer on the substrate such that the first barrier layer contacts the substrate; disposing a first dielectric layer on the first barrier layer and between the first dummy gate and the second dummy gate; disposing a second barrier layer on the first barrier layer such that the first dummy gate is disposed between a first portion of the second barrier layer and a second portion of the second barrier layer and such that the first portion of the second barrier layer and the second portion of the second barrier layer are disposed between a first portion of the first dielectric layer and a second portion of the first dielectric layer; removing the first dummy gate and the second dummy gate; forming a first metal gate and a second metal gate that are shorter than the first dummy gate and the second dummy gate, wherein the first metal gate is disposed between the first portion of the second barrier layer and the second portion of the second barrier layer; disposing a third barrier layer between the first portion of the second barrier layer and the second portion of the second barrier layer such that the first metal gate is disposed between the third barrier layer and the substrate; disposing a second dielectric layer such the third barrier layer is disposed between the first metal gate and the second dielectric layer; and forming a contact hole that is positioned between the first metal gate and the second metal gate and is positioned through the second dielectric layer and the first dielectric layer.

In one or more embodiments, the method may include the following step: disposing a portion of the second dielectric layer inside a recess of the third barrier layer, wherein a width of the portion of the second dielectric layer is equal to or less than two-thirds of a width of the first metal gate.

In one or more embodiments, the method may include the following step: etching the third barrier layer to form a recess; and disposing a portion of the second dielectric layer inside the recess.

In one or more embodiments, the method may include the following steps: coating a first portion of the third barrier layer on the first portion of the second barrier layer, coating a second portion of the third barrier layer on the second portion of the second barrier layer, and coating a third portion of the third barrier layer on the first metal gate, such that a space is formed between the first portion of the third barrier layer and the second portion of the third barrier layer; and disposing a portion of the second dielectric layer inside the space.

In one or more embodiments, the method may include the following steps: disposing a fourth barrier layer on the second barrier layer and the first dielectric layer; and dispose a portion of the second dielectric layer through a through hole of the fourth barrier layer into a recess of the third barrier layer.

In one or more embodiments, the method may include the following step: forming the fourth barrier layer and the third barrier layer simultaneously using a same material.

In one or more embodiments, the method may include the following step: coating the same material on the first portion of the second barrier layer, a top portion of the first metal gate, and the second portion of the second barrier layer to form a space that includes the through hole of the fourth barrier layer and the recess of the third barrier layer.

In one or more embodiments, the method may include the following steps: etching both the second dielectric layer and the fourth barrier layer using a first fluorine-containing gas; etching the first dielectric layer using a second fluorine-containing gas different from the first fluorine-containing gas; and etching the first barrier layer using a third fluorine-containing gas different from the first fluorine-containing gas and second fluorine-containing gas.

In one or more embodiments, the method may include the following step: forming the second dielectric layer using at least one of a spin-on-glass process and a flowable chemical vapor deposition process.

In one or more embodiments, the method may include the following steps: etching the second dielectric layer using a first fluorine-containing gas; etching the first dielectric layer using a second fluorine-containing gas different from the first fluorine-containing gas; and etching the first barrier layer using a third fluorine-containing gas different from the first fluorine-containing gas and the second fluorine-containing gas.

In one or more embodiments, the method may include the following step: disposing a fourth barrier layer on the third barrier layer, the second barrier layer, and the first dielectric layer, wherein the fourth barrier layer is disposed between the first metal gate and the second dielectric layer.

In one or more embodiments, the method may include the following step: forming a through hole through the fourth barrier layer such that the through hole positioned between the first metal gate and the second dielectric layer; and disposing a portion of the second dielectric layer through the through hole.

One or more embodiments of the present invention may be related to a semiconductor device that may include the following elements: a semiconductor substrate; a first barrier layer formed over the semiconductor substrate; a first dielectric layer formed on the first barrier layer; a plurality of metal gates formed in the first dielectric layer over the semiconductor substrate, wherein each metal gate has a top and side surfaces, and is below the top surface of the first dielectric layer to form a first recess; a second barrier layer, the lower part of it being formed between the side surface of each metal gate and the first dielectric layer and the upper part of it being formed between the first recess and the first dielectric layer; a third barrier layer, filled in the first recess; a second dielectric layer, formed on both the first dielectric layer and the third barrier layer; and a contact hole, formed through the second dielectric layer, the first dielectric layer, and the first barrier layer, wherein the contact hole is located between two selected adjacent metal gates.

One or more embodiments of the present invention may be related to a method for manufacturing a semiconductor device with a contact hole. The method may include the following steps: step S1, forming a plurality of dummy gates on a semiconductor substrate; step S2, forming a first barrier layer on the semiconductor substrate, a second barrier layer on the side surfaces of the dummy gate, and forming a first dielectric layer on the first and second barrier layers in between the dummy gates; step S3, replacing the plurality of dummy gates with a plurality of metal gates, and removing the top portion of each metal gate to form a first recess; step S4, forming a third barrier layer in the first recess; step S5, forming a second dielectric layer on both the first dielectric layer and the third barrier layer; and step S6, forming a contact hole through the second dielectric layer, the first dielectric layer, and the first barrier layer, wherein the contact hole is located between two selected adjacent metal gates.

One or more embodiments of the present invention may be related to a method for manufacturing a semiconductor device with a contact hole. The method may include the following steps: step S1, forming a plurality of dummy gates on a semiconductor substrate; step S2, forming a first barrier layer on the semiconductor substrate, a second barrier layer on the surfaces of the dummy gate, and forming a first dielectric layer on the first and second barrier layers in between the dummy gates; step S3, replacing the plurality of dummy gates with a plurality of metal gates, and removing the top portion of each metal gate to form a first recess; step S4, forming a third barrier layer in the first recess and forming a fourth barrier layer on both the first dielectric layer and the third barrier layer; step S5, forming the second dielectric layer on the fourth barrier layer; and step S6, forming a contact hole through the second dielectric layer, the fourth barrier layer, the first dielectric layer, and the first barrier layer, wherein the contact hole is located between two selected adjacent metal gates.

DETAILED DESCRIPTION OF EMBODIMENTS

The detailed description is illustrative for the purpose of providing explanation of the present invention. All technical and scientific terms used in the present disclosure may have the same meaning that is generally understood by a person ordinarily skilled in the art of the present invention, unless indicated otherwise.

In the present application, the term "etch selectivity ratio" refers to etch speed ratio in relation to different materials; the term "a material having a low dielectric constant" refers to a material having a dielectric constant less than 3; and the term "a material having a high dielectric constant" refers to a material having a dielectric constant greater than 8.

Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

Figure 1:
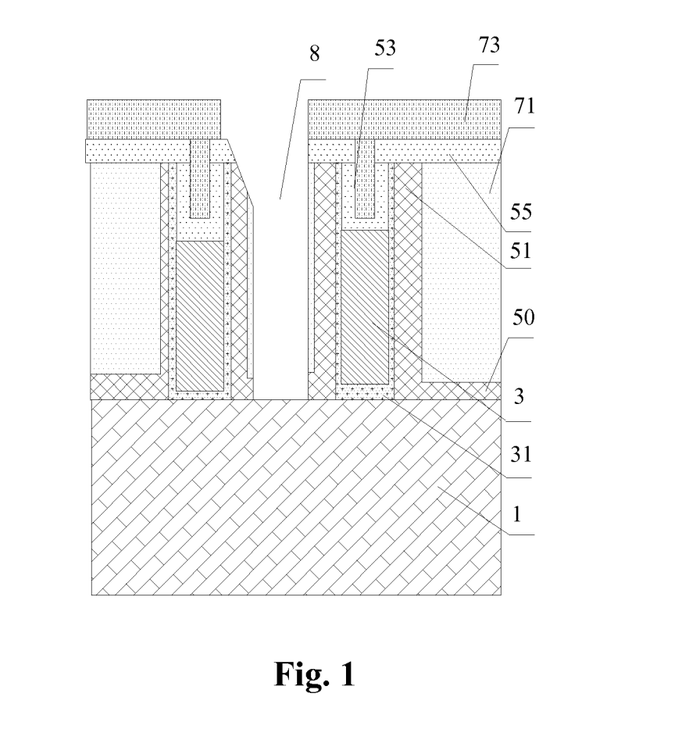
FIG. 1 is a schematic diagram illustrating a cross section of a semiconductor device with a (self-aligned) contact hole according to one or more embodiments of the present invention.

FIG. 1 is a schematic diagram illustrating a cross section of a semiconductor device with a (self-aligned) contact hole 8 according to one or more embodiments of the present invention. The semiconductor device may include a semiconductor substrate 1, a first barrier layer 50, a first dielectric layer 71, a plurality of metal gates 3, (optionally) a plurality of gate dielectric layers 31 corresponding to the metal gates 3, a second barrier layer 51, a third barrier layer 53, a second dielectric layer 73, and (optionally) a fourth barrier layer 55. The first barrier layer 50 is formed on the semiconductor substrate 1. The first dielectric layer 71 is formed on the first barrier layer 50. A plurality of metal gates 3 are formed in the first dielectric layer on the semiconductor substrate 1, wherein each metal gate 3 has a top and side surfaces and is disposed below the top surface of the first dielectric layer to form a first recess. The second barrier layer 51 comprises a lower part and a upper part, wherein the lower part of the second barrier layer 51 is formed between a side surface of a metal gate 3 and a lower portion of the first dielectric layer, and the upper part of the second barrier layer 51 is formed between a first recess and an upper portion of the first dielectric layer. The third barrier layer 53 is filled (and/or disposed) in the first recess. Each of the second dielectric layer 73 and the fourth barrier layer 55 is formed on (and overlaps) both the first dielectric layer 71 and the third barrier layer 53. The contact hole 8 is formed through the second dielectric layer 73, the fourth barrier layer 55, the first dielectric layer 71, and the first barrier layer 50, wherein the contact hole is located between two selected (immediately) adjacent metal gates.

The semiconductor device with the contact hole 8 may have a height difference between the metal gates 3 and each of the first dielectric layer 71 and the second barrier layer 51, wherein the upper surfaces of the metal gates 3 are lower than the upper surfaces of each of the first dielectric layer 71 and the second barrier layer 51. In the process of fabricating the contact hole 8 between two gates 3 along side walls of barrier layers 51 and/or 50, the contact hole 8 is made parallel to the gates 3 to be a so-called a self-aligned contact hole. Etching of upper parts of the metal gates 3 may be prevented or minimized by filling the third barrier layers 53 in the first recesses formed between the upper surfaces of the metal gates 3 and the upper surfaces of the second barrier layers 51 with respect to the metal gates 3. Potential exposure of the metal gates 3 during the process of fabricating the self-aligned contact hole 8 and potential short-circuit between the self-aligned contact hole 8 and the metal gates 3 are avoided or minimized With the structure according to one or more embodiments of the invention, self-aligned contact holes may be formed in gate-last processes to meet miniaturization requirements and electrical performance requirements of semiconductor devices with minimum risks of short-circuit between contact holes and metal gates.

According to one or more embodiments of the present invention, the first barrier layer 50 and the second barrier layer 51 are formed simultaneously. In one or more embodiments, materials of the first barrier layer 50, the second barrier layer 51, and the third barrier layer 53 may be the same. Same material can be disposed with a same process, and thus the fabrication process may be simplified, the difficulty of operation thereof may be reduced, and cost may be saved. In one or more embodiments, different barrier layers may include different materials. In one or more embodiments, according to different electrical performance requirements and miniaturization requirements, different materials may be used to dispose different barrier layers in order to minimize a contact resistance of the semiconductor device and to improve the electrical performance. At least one of the materials of the second barrier layer 51 and the third barrier layer 53 may have an etch rate that is at most one sixths of the etch rate of the material of the first dielectric layer 71 with respect to an etchant used for forming the contact hole 8, so that the second barrier layer 51 and/or the third barrier layer 53 may have an etch selectivity ratio greater than 6 against the first dielectric layer 71 when the first dielectric layer 71 is etched by the etchant to form the contact hole 8. In one or more embodiments, a material of the first dielectric layer 71 is $SiO_2$ and has an etch rate at least 6 times the etch rate of the material of the third barrier layer 53 with respect to the etchant used for forming the contact hole 8. Therefore, the gate 3 may be sufficiently protected by the third barrier layer 53. Additionally or alternatively, a suitable etchant may be selected to realize a sufficiently high etch selectivity.

In one or more embodiments, one or more of the barrier layers 50, 51, and 53 may comprise one or more of SiN, SiCN, SiC, and SiON. In one or more embodiments, one or more of the barrier layers 50, 51, 53 may be made of one or more of SiN, SiCN, SiC, and SiON. In one or more embodiments, the material of the third barrier layer 53 may have an etch rate that is equal to or less than one sixths of the etch rate of the material of the first dielectric layer 71 with respect to the etchant used for forming the contact hole 8.

In one or more embodiments, the materials of the first dielectric layers 71 and the second dielectric layers 73 may be the same, as same material can be disposed with a same process, and thus the fabrication process may be simplified, the difficulty of operation thereof may be reduced, and cost may be saved. In one or more embodiments, different dielectric layers may include different materials, according to different electrical performance requirements and miniaturization requirements, different materials may be used to dispose different barrier layers in order to minimize a contact resistance of the semiconductor device and to improve the electrical performance, In one or more embodiments, one or more of dielectric layers 71 and 73 may include one or more of an oxide, a material having a low dielectric constant, and an insulating material comprising an oxide that has a low dielectric constant. One or more of dielectric layers 71 and 73 can be formed through one or more of chemical vapor deposition, spin-coating, and atomic layer deposition.

In one or more embodiments, a fourth barrier layer 55 is formed on (and covers) both the first dielectric layer 71 and the third barrier layer 53. The second dielectric layer 73 is formed on the fourth barrier layer 55. The third barrier layer 53 and the fourth barrier layer 55 may be formed simultaneously with the part extending over the first dielectric layer 71 being called the fourth barrier layer 55. In one or more embodiments, one complete barrier layer, which includes the barrier layers 53 and 55, extends continuously on the upper surfaces of the metal gate 3, the second barrier layer 51, and the first dielectric layer 71, for covering and/or protecting substantially the whole upper surface of the semiconductor device. The thickness of barrier layers (e.g., the collective thickness of the barrier layers 53 and 55) located above the metal gate 3 may be greater than that of other parts (e.g., the respective thickness of the fourth barrier layer 55) to serve an etch barrier function during the process of fabricating the self-aligned contact hole 8 for better protecting the metal gates 3. In one or more embodiments, a "gate-last process" and a "process of fabricating the self-aligned contact hole" can be effectively combined, and potential short-circuit between the self-aligned contact hole and the metal gate may be substantially prevented. In one or more embodiments, the barrier layers 53 and/or 55 may be formed or SiN or a material similar to SiN. In one or more embodiments, an electron microscope test pattern may be used in the subsequent quality monitoring for detecting anomaly and/or quality problems of various layer structures of the manufactured semiconductor device. In one or more embodiments, the third barrier layer 53 coats the inner surface of the first recess without filling the first recess, thereby forming a second recess, and a portion of the second dielectric layer 73 extends into the second recess and fills the second recess. The second recess extends along the extending direction of the metal gate 3, wherein the extending direction of the metal gate 3 is perpendicular to the cross section of the semiconductor device illustrated in FIG. 1. The second recess may overlap the metal gate 3 in a direction perpendicular to the top surface of the semiconductor substrate 1. The second recess may be aligned with the metal gate 3 in the direction perpendicular to the top surface of the semiconductor substrate 1.

In one or more embodiments, a fourth barrier layer 55 is formed on (and overlaps) both the first dielectric layer 71 and the third barrier layer 53. The third barrier layer 53 coats the first recess without filling the first recess, thereby forming a second recess, wherein the second dielectric layer 73 extends into the second recess through a hole of the fourth barrier layer 55. The fourth barrier layer 55 is disposed under the second dielectric layer 73, is disposed between the first dielectric layer 71 and the second dielectric layer 73, is disposed between the third barrier layer 53 and the second dielectric layer 73, is disposed between the second barrier layer 51 and the second dielectric layer 73. A portion of the second dielectric layer 73 extends into the second recess and fills the second recess.

The second recess in the third barrier layer 53 located on the upper surfaces of the metal gate 3 and filled by a part of the dielectric material of the second dielectric layer 73 may substantially minimize potential defects formed in the third barrier layer 53 (e.g., by a SiN gas) and/or may substantially minimize misjudgment in quality monitoring of the semiconductor device.

In one or more embodiments, the second dielectric layer 73 may be formed of a silicon oxide using at least one of a spin-on-glass process and a flowable chemical vapor deposition process. The dielectric material of the second dielectric layer 73 can substantially compactly fill up the second recess, can minimize potential defects that might be formed by a gas in the third barrier layer 53, and/or can minimize misjudgment in quality monitoring process of the semiconductor device.

In the present application, a width (in the cross section of the semiconductor device) may refer to a length parallel to the top surface of the semiconductor substrate 1 and perpendicular to an extending direction of the metal gate 3, wherein the extending direction of the metal gate 3 is perpendicular to the cross section of the semiconductor device illustrated in FIG. 1. In one or more embodiments, a width of the second recess may be less than the width of the metal gate 3. The second recess may be formed at a central location of the first recess, may overlap the central position of the third barrier layer 53 located on the upper surfaces of the metal gate 3, and may extend along the extending direction of the metal gate 3. In one or more embodiments, the width of the second recess is less than two-thirds of the width of the metal gate 3 such that the third barrier layer 53 may have a sufficient thickness for protecting the metal gates when fabricating the contact hole.

In one or more embodiments, the semiconductor device may include one or more spacers disposed between side surfaces of each metal gate 3 and inner surfaces of each second barrier layer 51. Multiple layers of spacers, e.g. 1-10 layers, can be formed according to particular embodiments. In one or more embodiments, the one or more spacers may include one or more of an oxides, a material having a low dielectric constant, and SiN.

In one or more embodiments, a side wall of the contact hole 8 (provided by the second barrier layer 51 and/or the first barrier layer 50) may be greater than to the bottom of the contact hole 8 (provided by the substrate 1); the depth of the contact hole 8 may be greater than the width of the contact hole 8. Such structure may minimize a contact resistance of the semiconductor device and may improve the electrical performance of the semiconductor device.

Figure 2:
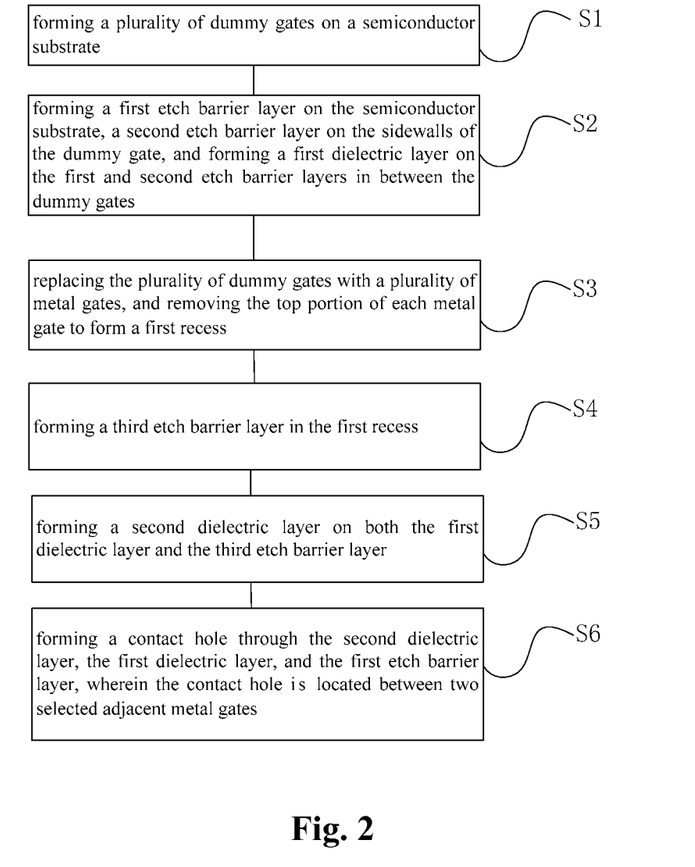
FIG. 2 shows a flow chart illustrating a method for manufacturing a semiconductor device with a (self-aligned) contact hole according to one or more embodiments of the present invention.

FIG. 2 shows a flow chart illustrating a method (or process) for manufacturing the semiconductor device illustrated in FIG. 1 according to one or more embodiments of the present invention. FIGS. 3a-3f illustrate cross sections of structures illustrating steps of the method illustrated in FIG. 2 according to one or more embodiments of the present invention. The method may include the following steps: Step 51, forming a plurality of dummy gates 3' on a semiconductor substrate 1; Step S2, forming a first barrier layer 50 on the semiconductor substrate 1, forming a second barrier layer 51 on the side surfaces of the dummy gate 3', and forming a first dielectric layer 71 on the barrier layers 50 and 51 (and between the dummy gates 3'); Step S3, replacing the plurality of dummy gates 3' with a plurality of preliminary metal gates 3", and removing a top portion of each preliminary metal gate 3" to form a metal gate 3 and to form a first recess above each metal gate 3; Step S4, forming a third barrier layer 53 in the first recess; Step S5, forming a second dielectric layer 73 on both the first dielectric layer 71 and the third barrier layer 53; and Step S6, forming a contact hole 8 through the second dielectric layer 73, the first dielectric layer 71, and the first barrier layer 50, wherein the contact hole 8 is located between two (immediately) adjacent selected metal gates 3.

During the manufacturing process, top portions of the preliminary metal gates 3" are removed for forming first recesses above the metal gates 3, such that upper surfaces of the metal gates 3 are lower than the upper surfaces of the second barrier layers 51. The third barrier layer 53 is filled in the first recesses formed on the upper surfaces of the metal gates 3 and formed between portions of the second barrier layer 51. The barrier layers 51 and 53 may substantially protect the metal gates from etchant and/or heat during the manufacturing process of the semiconductor device, and the barrier layers 51 and 53 may electrically insulate the metal gates from the contact hole 8. Advantageously, embodiments of the invention may substantially satisfy electrical performance requirements and miniaturization requirements of semiconductor devices.

According one or more embodiments of the present application, a method for manufacturing a semiconductor device with a contact hole may include the following steps: S1, forming a plurality of dummy gates 3' on a semiconductor substrate 1; S2, forming a first barrier layer 50 on the semiconductor substrate 1, forming a second barrier layer 51 on the surfaces of the dummy gate 3', and forming a first dielectric layer 71 on the barrier layers 50 51 (and between the dummy gates); S3, replacing the plurality of dummy gates with a plurality of preliminary metal gates 3", and removing the top portion of each metal gate to form a metal gate 3 and to form a first recess above each metal gate 3; S4, forming a third barrier layer 53 in the first recess and forming a fourth barrier layer 55 on both the first dielectric layer 71 and the third barrier layer 53; S5, forming a second dielectric layer 73 on the fourth barrier layer 55; and S6, forming a contact hole 8 through the second dielectric layer 73, the fourth barrier layer 55, the first dielectric layer 71, and the first barrier layer 50, wherein the contact hole 8 is located between two (immediately) adjacent selected metal gates 3.

The fourth barrier layer 55 may continuously extend and cover the upper surfaces of the second barrier layer 51, the first dielectric layer 71, and the third barrier layer 53. Such structure of overall coverage can protect substantially the whole upper surface of the semiconductor device. Advantageously, the structure of the semiconductor device may be optimized, and/or the manufacturing process of the semiconductor device may be simplified.

In one or more embodiments, step S4 may include forming a second recess on the top surface of the third barrier layer 53 and inside the first recess. And in the existence of the fourth barrier layer 55, the second recess is formed through the fourth barrier layer 55. In one or more embodiments, step S5 may include filling the second recess with the second dielectric layer 73. The portion of the second dielectric layer 73 that is disposed inside the second recess may be disposed between two portions of the third barrier layer 53 (which form sidewalls of the second recess), and the two portions of the third barrier layer 53 may be disposed between two portions of the second barrier layer 51 (which form sidewalls of the first recess). A portion of the third barrier layer 53 may be disposed between a portion of the second barrier layer 51 and the portion of the second dielectric layer 73 that is disposed inside the second recess.

In one or more embodiments, the second recesses can be formed after a preliminary third barrier layer has been formed, wherein the preliminary third barrier layer is etched to form the second recesses and the third barrier layer 53. In one or more embodiments, in the process of forming the third barrier layer 53, a second recess is formed by coating the first recess with the third barrier layer 53 material without filling it with the third barrier layer 53 material, such that the second recess exists above a bottom portion of the third barrier layer 53 and between two side portions of the third barrier layer 53; accordingly, there may be no need to etch the third barrier layer 53 material, such that operation steps may be simplified and that process cost may be saved.

In one or more embodiments, the second dielectric layer 73 may be formed through at least one of a spin-on glass process and a flowable chemical vapor deposition process. The material of the second dielectric layer 73 may have relatively good filling properties to substantially fill the second recess. As a result, there may be no presence of the third barrier layer 53 at the central portion of the first recess, and potential defects in the semiconductor device caused by gases may be prevented.

In one or more embodiments, step S2 may include forming a spacer on side surfaces of the dummy gate 3', and forming the second barrier layers 51 on side surfaces of the spacer. A material for forming the spacer may include at least one of an oxide, a material having a low dielectric constant, and SiN. The spacer may be fabricated using one or more fabricating processes that are well-known in the existing art.

According to one or more embodiments of the present invention, in step S6, the contact hole 8 (e.g., a self-aligned contact hole) may be formed through an etching process involving a fluorine-containing gas. In one or more embodiments, materials of various layers of the semiconductor structure can be etched with different fluorine-containing gases for forming one or more predetermined structures. In one or more embodiments, step S6 may include the following steps: disposing a mask layer (which has a pattern for the contact hole) on the second dielectric layer 73; etching the second dielectric layer 73 using a first fluorine-containing gas according to the pattern for the contact hole in the mask layer; etching the fourth barrier layer 55 using the first fluorine-containing gas; and etching the first dielectric layers 71 using a second fluorine-containing gas different from the first fluorine-containing gas; and etching the first barrier layer 50 on the semiconductor substrate 1 using a third fluorine-containing gas different from the first fluorine-containing gas and the second fluorine-containing gas to form the contact hole 8, which reaches the semiconductor substrate 1. In one or more embodiments, the first fluorine-containing gas includes at least one of $CF_4$ and $CHF_3$; the second fluorine-containing gas includes at least one of $C_4F_8$, $C_5F_8$, and $C_4F_6$; the third fluorine-containing gas includes at least one of $CHF_3$, $CH_2F_2$, $CH_3F$. Shapes of the contact hole in various layers can be configured according to particular embodiments. In one or more embodiments, a width of a part of the contact hole 8 located in the second dielectric layer 73 may be different from a width of a part of the contact hole 8 located in the fourth barrier layer 55. In one or more embodiments, a width of a part of the contact hole 8 at the top surface of the fourth barrier layer 55 may be larger than a width of a part of the contact hole 8 at the bottom surface of the fourth barrier layer 55. In one or more embodiments, a part of the contact hole 8 located in the first dielectric layer 71 can have a cylindrical structure with an equal area of cross sections.

In one or more embodiments, step S6 may include the following steps: disposing a mask layer (which has a pattern for the contact hole) on the second dielectric layer 73; etching the second dielectric layer 73 using a first fluorine-containing gas according to the pattern for the contact hole in the mask layer; etching the fourth barrier layer 55 using a second fluorine-containing gas different from the first fluorine-containing gas; etching the first dielectric layer 71 using the first fluorine-containing gas; and etching the first barrier layer 50 on the semiconductor substrate 1 using a third fluorine-containing gas different from the first fluorine-containing gas and the second fluorine-containing gas to form the self-aligned contact hole, which reaches the semiconductor substrate 1. In one or more embodiments, the first fluorine-containing gas includes at least one of $C_4F_8$, $C_5F_8$, and $C_4F_6$; the second fluorine-containing gas includes at least one of a gas $CF_4$ and $CHF_3$; the third fluorine-containing gas includes at least one of $CHF_3$, $CH_2F_2$, and $CH_3F$. Shapes of the contact hole in various layers can be configured according to particular embodiments. In one or more embodiments, a part of the contact hole located in the second dielectric layer 73 may have a first cylindrical structure with an equal area of cross sections, a part located in the fourth barrier layer 55 may have a conical structure with reducing areas of cross sections from outside to inside, and a part located in the first dielectric layer 71 may have a second cylindrical structure having an equal area of cross sections. A cross section area of the first cylindrical structure may be greater than a cross section area of the second cylindrical structure. A width of the first cylindrical structure may be greater than a width of the second cylindrical structure.

EXAMPLE 1

Specific steps of a method of manufacturing a semiconductor device with a contact hole (such as a self-aligned contact hole) according to one or more embodiments of the present application are discussed with reference to FIG. 2, FIG. 3a, FIG. 3b, FIG. 3c, FIG. 3d, FIG. 3e, and FIG. 3f. FIGS. 3a-3f illustrate cross sections of structures for illustrating steps in the method.

Figure 3A:
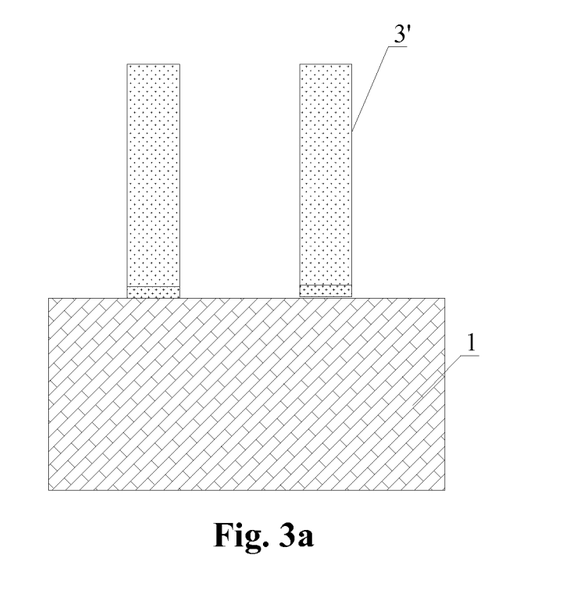
FIGS. 3a-3f illustrate cross sections of structures for illustrating steps in a method for manufacturing a semiconductor device with a (self-aligned) contact hole according to one or more embodiments of the present invention.

In step S1, as illustrated in FIG. 3a, a plurality of dummy gates 3' are formed on a semiconductor substrate 1. The semiconductor substrate 1 may be a monocrystalline or polycrystalline silicon substrate. The semiconductor substrate 1 may include silicon on an insulator. A source and a drain (not shown in the figure) may be formed on the substrate 1. The dummy gates 3' may include a polycrystalline silicon material. In one or more embodiments, dummy gate dielectric layers can be formed (through a thermal oxidation process) at positions on the substrate 1 where the dummy gates 3' are to be formed prior to formation of the dummy gates 3'. The dummy gate dielectric layers can be oxidizing material layers. The dummy gate dielectric layers can protect the substrate 1 during the process of etching and/or forming the dummy gates 3'.

Figure 3B:
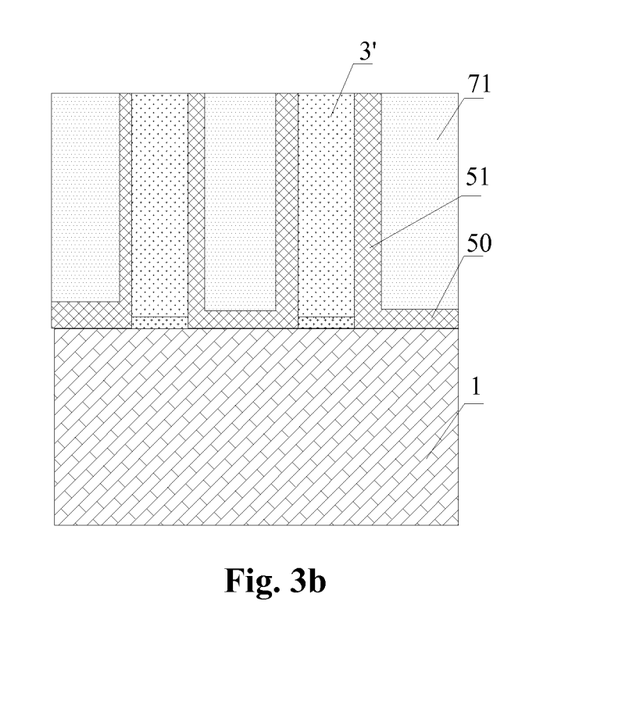

In step S2, as illustrated in FIG. 3b, a first barrier layer 50 is formed on the semiconductor substrate 1, a second barrier layer 51 is formed on surfaces of the dummy gate (at the same time when the first barrier layer 50 is formed), and a first dielectric layer 71 is formed on the barrier layers 50 and 51 and formed between the dummy gates 3'. The first dielectric layer 71 may have an upper surface even (or flush) with an upper surface of the second barrier layer 51. Each of the barrier layers 50 and 51 may have a thickness in a range of 50-200Å. Each of the barrier layers 50 and 51 may be made of and/or may include at least one of SiN, SiCN, SiC, and SiON. The barrier layers 50 and 51 may be formed through at least one of a chemical vapor deposition process and an atomic layer deposition process. A material of the first dielectric layer 71 may include an oxide, an insulation material having a low dielectric constant, and an insulating material that comprises an oxide having a low dielectric constant. In one or more embodiments, the insulating material may include at least one of phosphorosilicate glass, borosilicate glass, boron-phosphorosilicate glass, fluorsosilicate glass, black diamond, and spin-on glass. The first dielectric layer 71 may be formed through at least one of a chemical vapor deposition process, an atomic layer deposition process, and a spin-on process. After deposition of the first dielectric layer 71, the upper surfaces of the first dielectric layer 71, the second barrier layer 51, and/or the dummy gates 3' are planarized through chemical mechanical polishing.

Figure 3C:
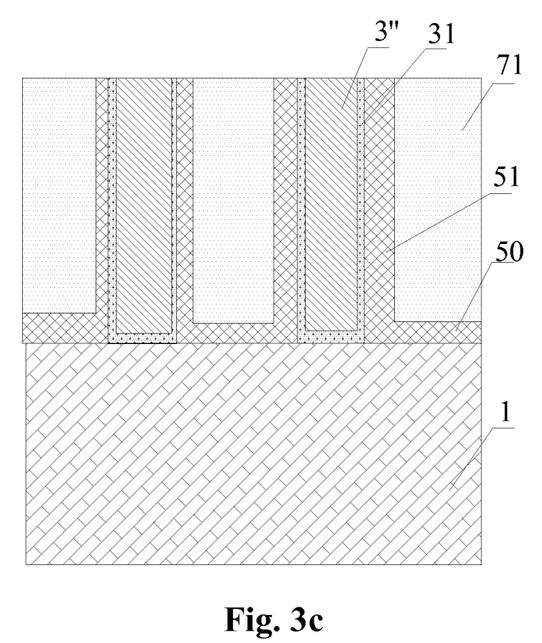

In step S3, as illustrated in FIG. 3c, the plurality of dummy gates 3' are replaced with a plurality of preliminary metal gates 3". In this process, the dummy gates 3' (e.g., made of a polycrystalline silicon material) can be removed through at least one of a wet etching process and a dry etching process; as a result, grooves are formed at corresponding positions of the original dummy gates 3'. A metal material having a high dielectric constant may be filed in the grooves to form the preliminary metal gates 3". In one or more embodiments, dummy gate dielectric layers are disposed between the dummy gates 3' and the substrate 1. The dummy gate dielectric layers may be removed during the process of removing the dummy gates 3'. Subsequently, the preliminary metal gates 3" are formed.

In one or more embodiments, the following steps can be used in the process of forming the preliminary metal gates 3".

Firstly, a gate dielectric layer 31 is formed on inner surfaces of the groove and upper surfaces of the second barrier layers 51 and the first dielectric layers 71, wherein a part of the gate dielectric layer 31 that is located in the groove also has a groove structure. Process steps of forming the gate dielectric layer 31 may include the following steps: forming a silica interfacial layer having a thickness in a range of 5-7 Å on the (e.g., silicon) substrate at the bottom of the groove through a thermal oxidation process and/or a chemical oxidation process; forming a layer with a material having a high dielectric constant and having a thickness in a range of 10-20 Å on upper surfaces of the silica interfacial layer, side surfaces of the groove (provided by the second barrier layer 51), upper surfaces of the second barrier layers 51, and upper surfaces of the first dielectric layers 71 through a physical vapor deposition process and/or a chemical vapor deposition process. The silica interfacial layer and the layer with the high-dielectric-constant material may be collectively called a gate dielectric layer. The high-dielectric-constant layer may include at least one of $HfO_2$, HfSiO, and HfSiNO. In one or more embodiments, a layer of metal covering layer may be formed on the gate dielectric layer 31 to protect the gate dielectric layer. The metal covering layer may include TiN and/or TaN.

Subsequently, a metal layer is formed on a surface of the gate dielectric layer 31. The metal layer may have one part that is filled in the groove structure formed by the gate dielectric layer 31, and the metal layer may have another part that covers surfaces of the gate dielectric layer 31 that are located on the second barrier layers 51 and the first dielectric layers 71. Steps of forming the metal layer may include the following steps: forming the metal layer on the surface of the high-dielectric-constant material through a physical vapor deposition process and/or a chemical vapor deposition process. The metal layer may be a composite metal layer and may include one or more layers made of one or more of TiN, TaN, TiAl, TiAlN, TiAlCO, Ti, Ta, Al, and W.

Subsequently, the metal layer and the gate dielectric layer 31 are polished and/or thinned in a chemical mechanical polishing process until the upper surfaces of portions of the first dielectric layers 71 between portions of the second barrier layers are exposed. As a result, top surfaces of the remaining metal layer may be even with the upper surfaces of the first dielectric layers 71 and the remaining metal layer may form the preliminary metal gates 3".

Figure 3D:
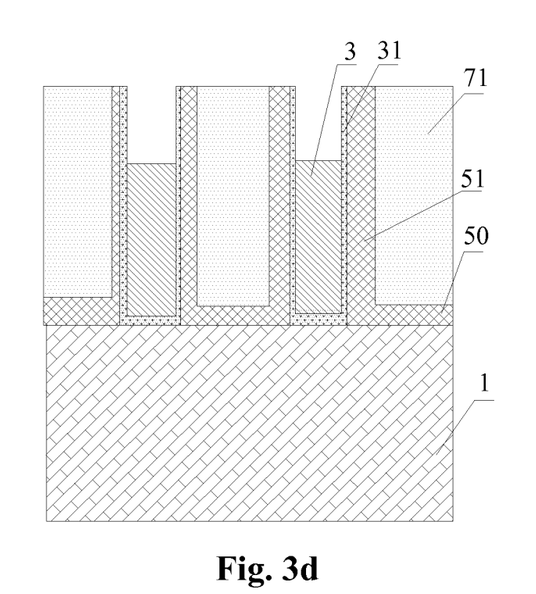

As illustrated in FIG. 3d, a top portion of the preliminary metal gate 3" is removed to form the metal gate 3 and to form a first recess positioned above an upper surface of the metal gate 3 and positioned between two parts of the second barrier layer 51 (and between two parts of the gate dielectric layers 31) that are higher than the upper surface of the metal gate 3. The top portion of the preliminary metal gate 3" may be removed through wet etching, to form a first recess structure. A mixture solution containing an acid (such as hydrochloric acid) and an oxidant (such as hydrogen peroxide) can be used in the wet etching.

Figure 3E:
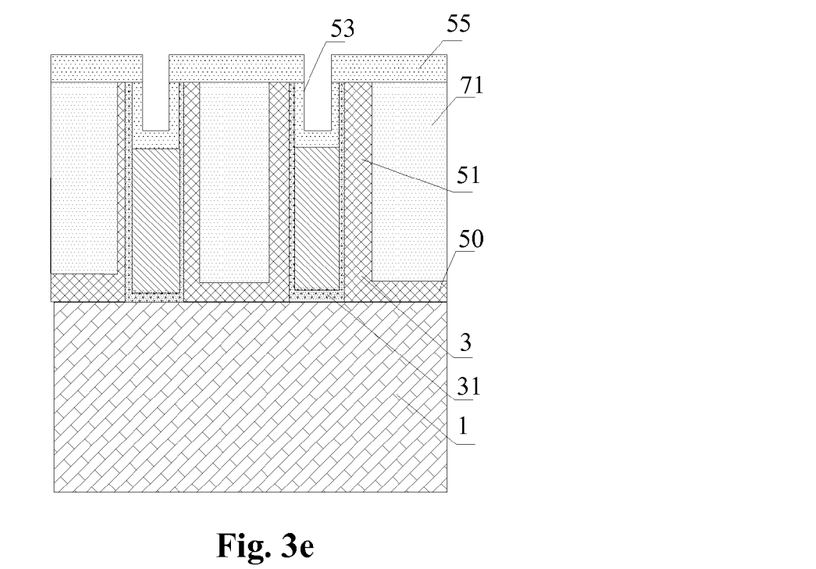

In step S4, as illustrated in FIG. 3e, a third barrier layer 53 is formed on inner surfaces of the first recess. The material of the third barrier layer 53 may have a high selectivity ratio with respect to the first dielectric layer 71. In one or more embodiments, the material for forming the third barrier layer 53 is a material having an etch selectivity ratio of greater than 6 against the first dielectric layer 71 (in other words, the third barrier layer 53 may have an etch rate that is less than one sixth of the etch rate of the first dielectric layer 71 when both are etched by a same selected etchant). In one or more embodiments, as the third barrier layer 53 may include at least one of SiN, SiCN, SiC, and SiON. In one or more embodiments, the material of the third barrier layer 53 is an SiN material having an etch rate that is less than or equal to one tenth of the etch rate of the first dielectric layer 71 in an etchant. The third barrier layer 53 is formed through a chemical vapor deposition process and/or an atomic layer deposition process.

Figure 3F:
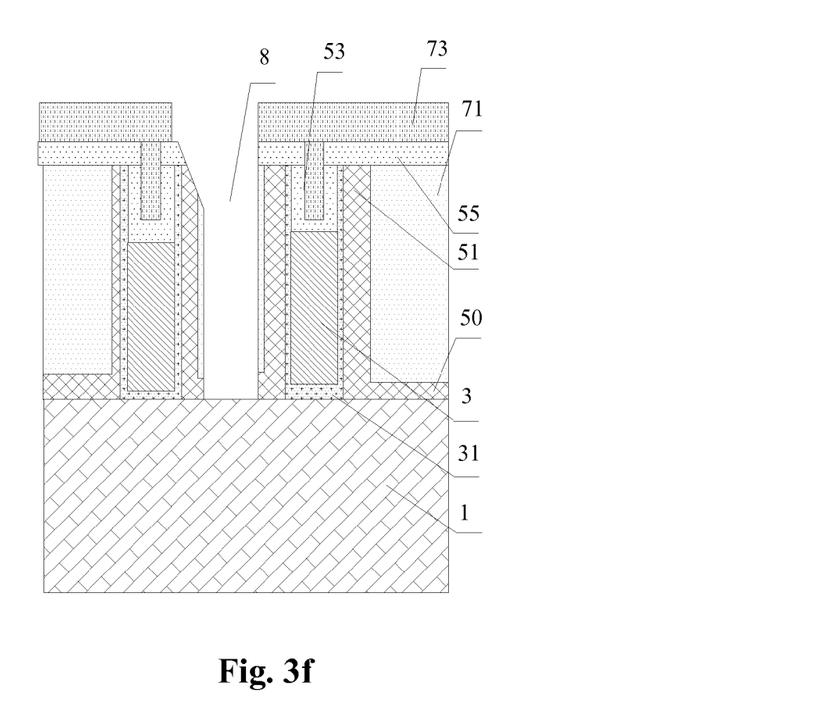

In step S5, as illustrated in FIG. 3f, a second dielectric layer 73 is formed on upper surfaces of the first dielectric layer 71, the second barrier layer 51, and the third barrier layer 53. A material for forming the second dielectric layer 73 may include an oxide and/or a material having a low dielectric constant. The method for forming the second dielectric layer 73 can include chemical vapor deposition and/or atomic layer deposition. After deposition of the second dielectric layer 73, surfaces thereof are planarized through chemical mechanical polishing.

In step S6, a self-aligned contact hole 8 having a bottom portion located between two adjacent metal gates 3 may be formed through the following steps: coating a mask layer (which also can be called as photoresist) containing a contact hole pattern on the second dielectric layer 73; etching the second dielectric layer 73 and the second barrier layers 53 using a gas containing $CF_4$ and/or $CHF_3$ according to the contact hole pattern; etching the first dielectric layer 71 using a gas containing at least one of $C_4F_8$, $C_5F_8$, and $C_4F_6$; and etching the first barrier layer 51 (which is disposed on the upper surface of the substrate 1) using a gas containing at least one of $CHF_3$, $CH_2F_2$, and $CH_3F$ after completing the step of etching the first dielectric layers 71. As a result, the self-aligned contact hole may be formed and may reach the substrate 1.

EXAMPLE 2

In one or more embodiments, a method for manufacturing a semiconductor device with a contact hole may include the following steps S1-S6.

Steps S1-S3 may be substantially analogous to the steps S1-S3 in Example 1 discussed above.

In step S4, a third etch barrier layer 53 is formed in the first recess using a material having an etch rate that is less than or equal to one eighth of the etch rate of the first dielectric layer 71. In one or more embodiments, the material of the third barrier layer 53 may include SiN. A continuously extending fourth barrier layer 55 is formed on the upper surfaces of the metal gates 3, the second barrier layer 51, the first dielectric layer 71, and the third barrier layer 53. The fourth barrier layer 55 can be formed at the same time with the third barrier layer 53. The fourth barrier layer 55 and the third barrier layer 53 may be formed through a chemical vapor deposition process.

In step S5, a second dielectric layer 73 is formed on the upper surface of the fourth barrier layer 53. A material for forming the second dielectric layer 73 is an insulation material having a low dielectric constant. The second dielectric layer 73 is formed through a chemical vapor deposition process. After deposition of the second dielectric layer 73, surfaces thereof can be further planarized through chemical mechanical polishing.

In step S6, a self-aligned contact hole 8 having a bottom portion located between the two selected adjacent metal gates 3 may be formed through the following steps: coating a mask layer (which also can be called as photoresist) containing a self-aligned contact hole pattern on the second dielectric layer 73; etching the second dielectric layer 73 using a gas containing at least one of $C_4F_8$, $C_5F_8$, and $C_4F_6$ according to the self-aligned contact hole pattern; etching the fourth barrier layer 55 using a gas containing $CF_4$ and/or $CHF_3$; etching the first dielectric layer 71 using a gas containing at least one of $C_4F_8$, $C_5F_8$, and $C_4F_6$; and etching the first barrier layer 50 (which is disposed on the upper surface of the substrate 1) using a gas containing at least one of $CHF_3$, $CH_2F_2$, and $CH_3F$ to form the self-aligned contact hole, which may reach the substrate 1.

EXAMPLE 3

In one or more embodiments, a method for manufacturing a semiconductor device with a contact hole may include the following steps S1-S6.

Steps S1-S3 may be substantially analogous to the steps S1-S3 Example 1, and Step S6 may be substantially analogous to the step S6 Example 2.

In step S4, a third etch barrier layer 53 is formed in the first recess using a material having an etch rate that is less than or equal to one sixth of the etch rate of the first dielectric layers 71. In one or more embodiments, the material of the third barrier layer 53 may include SiN. A continuously extending barrier layer that includes third barrier layer 53 and the fourth barrier layer 55 is formed on the upper surfaces of the metal gates 3, the first barrier layers 51 and the first dielectric layers 71. The material for forming the continuous extending barrier layer may coat inner surfaces of the first recess without filling the first recess, with a second recess being formed above the bottom portion of the third barrier layer 53, formed between two portions of the third barrier layer 53, and formed through the fourth barrier layer 55. The third barrier layer 53 is formed through a chemical vapor deposition process.

In step S5, in one or more embodiments, a spin-on glass (SOG) is used as the material of the second dielectric layer 73, and the second dielectric layer 73 is formed on the upper surface of the fourth barrier layer 55 through a spin-on-glass process, wherein a part of the second dielectric layer 73 is filled in the second recess. In one or more embodiments, the second dielectric layer 73 is formed through chemical vapor deposition. After deposition of the second dielectric layer 73, surfaces thereof are planarized through chemical mechanical polishing.

In accordance with Example 1, the third barrier layer 53 (in addition to the second barrier layer 51) may protect the metal gate 3 from heat and/or etchants and may prevent or minimize short-circuit between the self-aligned contact hole and the metal gates, such that the "gate-last process" and the "process of fabricating the self-aligned contact hole" may be effectively combined to satisfy performance requirements and miniaturization requirements of semiconductor devices are met.

In accordance with Example 2, the fourth barrier layer 55 may enhance gate metal protection and/or may enhance short-circuit prevention.

In accordance with Example 3, the second recesses formed in the barrier layers 53 and 55, located above the metal gates 3, and filling a portion of the second dielectric layer 73 may minimize defects in the barrier layers 53 and 55, thereby facilitating quality monitoring and quality assurance of semiconductor devices.

The above mentioned is illustrative of embodiments of the present invention but is not intend to limit the present invention. Various alterations and changes to embodiments of the present invention are apparent to those skilled in the art. Any modifications, equivalent substitutions, improvements, etc. to embodiments of the invention are within the scope of the invention that is defined by the following claims.

What is claimed is:

1. A semiconductor device comprising:
   a substrate;
   a first barrier layer disposed on the substrate;
   a first dielectric layer disposed on and directly contacting the first barrier layer;
   a second barrier layer disposed on the first barrier layer, wherein a first portion of the second barrier layer and a second portion of the second barrier layer are disposed between a first portion of the first dielectric layer and a second portion of the first dielectric layer;
   a third barrier layer disposed between the first portion of the second barrier layer and the second portion of the second barrier layer;
   a first metal gate disposed between the first portion of the second barrier layer and the second portion of the second barrier layer and disposed between the third barrier layer and the substrate, wherein no portion of the second barrier layer is disposed between the first metal gate and the substrate in a direction perpendicular to the substrate;
   a second dielectric layer, wherein the third barrier layer is disposed between the first metal gate and the second dielectric layer;
   a second metal gate; and
   a contact hole positioned between the first metal gate and the second metal gate and positioned between the second portion of the first dielectric layer and a third portion of the first dielectric layer.

2. The semiconductor device of claim 1, further comprising a fourth barrier layer, the fourth barrier layer being connected to the third barrier layer and contacting each of the second barrier layer and the first dielectric layer, wherein the first dielectric layer is disposed between the first barrier layer and the fourth barrier layer.

3. The semiconductor device of claim 1, wherein an etch rate of the third barrier layer in an etchant is less than or equal to one sixth of an etch rate of the first dielectric layer in the etchant.

4. The semiconductor device of claim 1,
   wherein at least one of the second barrier layer and the third barrier layer includes at least one of SiN, SiCN, SiC, or SiON,
   wherein the second dielectric layer includes a glass material, and
   wherein at least one of the first dielectric layer and the second dielectric layer includes an oxide having a dielectric constant less than 3.

5. The semiconductor device of claim 1, wherein the second portion of the first dielectric layer and the third portion of the first dielectric layer are positioned between the first metal gate and the second metal gate.

6. A semiconductor device comprising:
   a substrate;
   a first barrier layer disposed on the substrate;
   a first dielectric layer disposed on and directly contacting the first barrier layer;
   a second barrier layer disposed on the first barrier layer, wherein a first portion of the second barrier layer and a second portion of the second barrier layer are disposed between a first portion of the first dielectric layer and a second portion of the first dielectric layer;
   a third barrier layer disposed between the first portion of the second barrier layer and the second portion of the second barrier layer;

a first metal gate disposed between the first portion of the second barrier layer and the second portion of the second barrier layer and disposed between the third barrier layer and the substrate;

a second dielectric layer, wherein the third barrier layer is disposed between the first metal gate and the second dielectric layer;

a second metal gate, wherein a first portion of the second dielectric layer is disposed between a first portion of the third barrier layer and a second portion of the third barrier layer.

7. The semiconductor device of claim 6, wherein a third portion of the third barrier layer is disposed between the first portion of the second dielectric layer and the first metal gate, wherein the first portion of the second dielectric layer is disposed between the third portion of the third barrier layer and a second portion of the second dielectric layer, and wherein the second portion of the second dielectric layer is wider than the first portion of the second dielectric layer.

8. The semiconductor device of claim 6, further comprising a fourth barrier layer, wherein the fourth barrier layer overlaps the second dielectric layer and is connected to the third barrier layer, wherein a first portion of the second dielectric layer is disposed between a first portion of the fourth barrier layer and a second portion of the fourth barrier layer, and wherein the first portion of the second dielectric layer is disposed between the second portion of the second dielectric layer and the third portion of the third barrier layer.

9. A method for forming a semiconductor device, the method comprising:

disposing a first dummy gate and a second dummy gate on a substrate;

disposing a first barrier layer on the substrate such that the first barrier layer contacts the substrate;

disposing a first dielectric layer on the first barrier layer such that the first dielectric layer directly contacts the first barrier layer;

after the first dummy gate has been disposed on the substrate, disposing a second barrier layer on the first barrier layer such that the first dummy gate is disposed between a first portion of the second barrier layer and a second portion of the second barrier layer and such that the first portion of the second barrier layer and the second portion of the second barrier layer are disposed between a first portion of the first dielectric layer and a second portion of the first dielectric layer;

removing the first dummy gate and the second dummy gate;

forming a first metal gate and a second metal gate that are shorter than the first dummy gate and the second dummy gate, wherein the first metal gate is disposed between the first portion of the second barrier layer and the second portion of the second barrier layer;

disposing a third barrier layer between the first portion of the second barrier layer and the second portion of the second barrier layer such that the first metal gate is disposed between the third barrier layer and the substrate;

disposing a second dielectric layer such the third barrier layer is disposed between the first metal gate and the second dielectric layer; and forming a contact hole that is positioned between the first metal gate and the second metal gate and is positioned through the second dielectric layer and the first dielectric layer.

10. The method of claim 9, further comprising disposing a portion of the second dielectric layer inside a recess of the third barrier layer, wherein a width of the portion of the second dielectric layer is equal to or less than two-thirds of a width of the first metal gate.

11. The method of claim 9, further comprising:

etching the third barrier layer to form a recess; and disposing a portion of the second dielectric layer inside the recess.

12. The method of claim 9, further comprising:

coating a first portion of the third barrier layer on the first portion of the second barrier layer, coating a second portion of the third barrier layer on the second portion of the second barrier layer, and coating a third portion of the third barrier layer on the first metal gate, such that a space is formed between the first portion of the third barrier layer and the second portion of the third barrier layer; and disposing a portion of the second dielectric layer inside the space.

13. The method of claim 9 further comprising:

disposing a fourth barrier layer on the second barrier layer and the first dielectric layer; and disposing a portion of the second dielectric layer through a through hole of the fourth barrier layer into a recess of the third barrier layer.

14. The method of claim 13, further comprising forming the fourth barrier layer and the third barrier layer simultaneously using a same material.

15. The method of claim 14, further comprising coating the same material on the first portion of the second barrier layer, a top portion of the first metal gate, and the second portion of the second barrier layer to form a space that includes the through hole of the fourth barrier layer and the recess of the third barrier layer.

16. The method of claim 13, further comprising:

etching both the second dielectric layer and the fourth barrier layer using a first fluorine-containing gas;

etching the first dielectric layer using a second fluorine-containing gas different from the first fluorine-containing gas; and etching the first barrier layer using a third fluorine-containing gas different from the first fluorine-containing gas and second fluorine-containing gas.

17. The method of claim 9, further comprising forming the second dielectric layer using at least one of a spin-on-glass process and a flowable chemical vapor deposition process.

18. The method of claim 9, further comprising:

etching the second dielectric layer using a first fluorine-containing gas;

etching the first dielectric layer using a second fluorine-containing gas different from the first fluorine-containing gas; and etching the first barrier layer using a third fluorine-containing gas different from the first fluorine-containing gas and the second fluorine-containing gas.

19. The method of claim 9, further comprising disposing a fourth barrier layer on the third barrier layer, the second barrier layer, and the first dielectric layer, wherein the fourth barrier layer is disposed between the first metal gate and the second dielectric layer.

20. The method of claim 19, further comprising:
forming a through hole through the fourth barrier layer such that the through hole positioned between the first metal gate and the second dielectric layer; and
disposing a portion of the second dielectric layer through the through hole.

* * * * *